United States Patent [19]

Shur

[11] Patent Number: 4,593,300

[45] Date of Patent: Jun. 3, 1986

[54] FOLDED LOGIC GATE

[75] Inventor: Michael Shur, Golden Valley, Minn.

[73] Assignee: The Regents of the University of Minnesota, Minneapolis, Minn.

[21] Appl. No.: 666,897

[22] Filed: Oct. 31, 1984

[51] Int. Cl.[4] .................... H01L 29/80; H01L 29/78; H01L 27/02; H01L 29/56

[52] U.S. Cl. .................................. 357/22; 357/23.2; 357/23.7; 357/23.9; 357/46; 357/15

[58] Field of Search .................. 357/23.2, 23.7, 46, 357/22, 23.9, 15

[56] References Cited

U.S. PATENT DOCUMENTS

| 4,476,475 | 10/1984 | Naem et al. | 357/23.7 |
| 4,502,202 | 3/1985 | Malhi | 357/23.9 |
| 4,554,572 | 11/1985 | Chatterjee | 357/71 |

FOREIGN PATENT DOCUMENTS 2503864 1/1975 Fed. Rep. of Germany ..... 357/23.7

OTHER PUBLICATIONS

Garnache, "Complimentary FET Memory Cell", *IBM Technical Disclosure Bulletin*, vol. 18, No. 12, May 1976, pp. 3947-3948.
Cirillo, N. C., Jr. et al, "Self-Aligned Modulation-Doped (Al,Ga)As/GaAs Field-Effect Transistors," *IEEE Electron Device Letters*, vol. EDL-5, No. 4, Apr. 1984.
Shur, M. S., "Low Field Mobility, Effective Saturation Velocity and Performance of Submicron GaAs MESFETs," *Electronic Letters*, vol. 18, No. 21, Oct. 14, 1982.
Eden, Richard C. et al, "The Prospects for Ultrahigh-Speed VLSI GaAs Digital Logic," *Journal of Solid State Circuits*, vol. SC-14, No. 2, Apr. 1979.

*Primary Examiner*—Martin H. Edlow
*Assistant Examiner*—Terri M. Henn
*Attorney, Agent, or Firm*—Kinney & Lange

[57] ABSTRACT

An FET logic gate structure includes two semiconductor layers separated by an insulator. An enhancement mode switching FET is formed in the top semiconductor layer, and a load element is formed in the bottom semiconductor layer. The insulator layer separates and capacitively couples the switching element and the load element so that the switching element acts as a gate for the load element and the load element acts as a second gate of the switching element. An input is connected to the gate of the switching element. The drain of the switching element, the source of the load element, and the output of the folded logic gate are connected together. The logic gate structure exhibits very low power consumption in stable states, high speed and large output voltage swings.

10 Claims, 5 Drawing Figures

U.S. Patent    Jun. 3, 1986    4,593,300
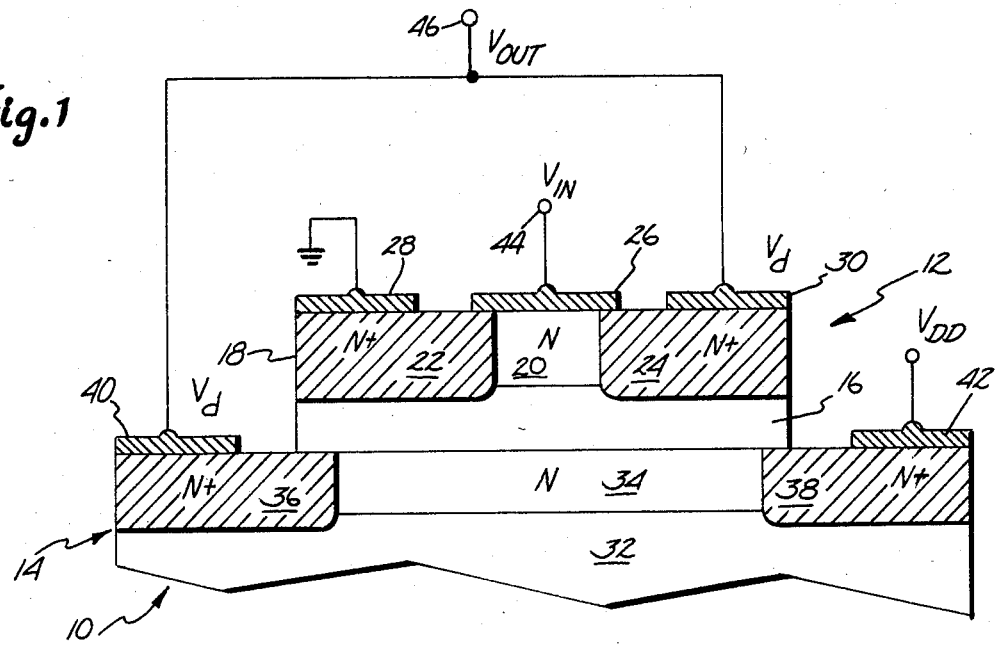
Fig. 1
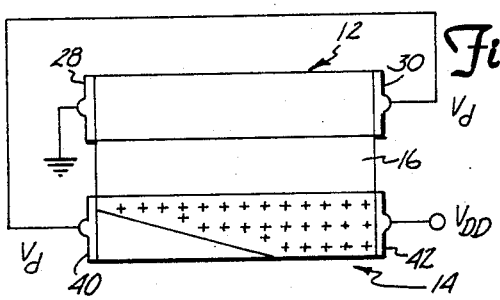
Fig. 2A
Fig. 2B
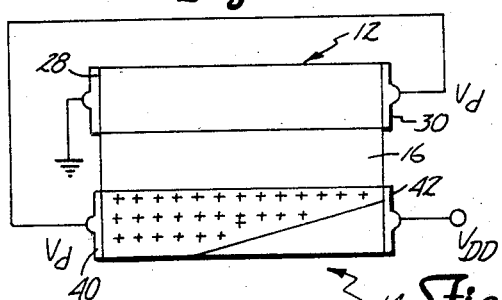
Fig. 2C
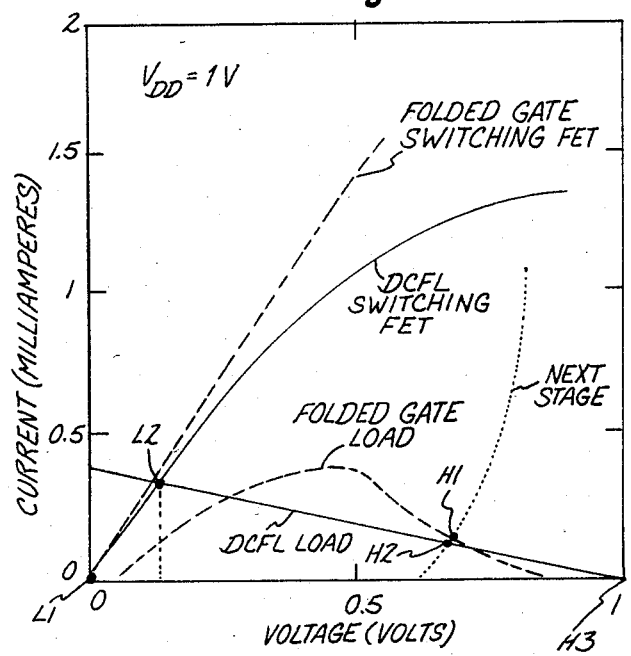
Fig. 3

FOLDED LOGIC GATE

BACKGROUND OF THE INVENTION

1. Field of the Invention.

The present invention relates to semiconductor logic gate devices. In particular, the present invention is a field effect transistor (FET) type of logic gate.

2. Description of the Prior Art.

Integrated circuits which utilize CMOS logic gates offer the advantage of lower power consumption. CMOS integrated circuits, however, require a relatively large number of processing steps since both N channel and P channel FETs are required. In addition, the speed of the CMOS logic is limited by the transport properties of "slow" carriers (holes).

Another type of integrated circuit FET logic is direct coupled field effect transistor logic (DCFL), which generally offers higher speed than CMOS logic. A DCFL logic gate typically uses an enhancement mode FET which is connected in series with either a resistor or an active load (formed by a normally-on depletion mode FET). The input of the DCFL logic gate is connected to the gate of the FET and the output is connected to the drain of the FET (which is also connected to the source of the load). DCFL logic consumes more power than CMOS logic because when the input voltage is high, the FET is turned on and current flows through both the FET and the load. In addition, DCFL logic gates exhibit relatively low output voltage swing between the two stable output states.

SUMMARY OF THE INVENTION

The present invention is a new logic structure which uses a "folded" gate to provide a majority carrier device which features very low power consumption in both of its stable states, speed comparable to or higher than the speed of conventional DCFL circuits, and larger output voltage swing.

The logic gate of the present invention includes a FET switching element formed by a first semiconductor layer, a load element formed by a second semiconductor layer which is positioned below the first semiconductor layer, and an insulator layer which is positioned between the first and second semiconductor layers and is sufficiently thin that there is strong capacitive coupling between the FET switching element and the load element. As a result, the switching element acts as a gate for the load element, and the load element acts as a second gate of the switching element.

The input of the logic gate is connected to the gate of the FET switching element. The source side of the load element must be physically located under the source side of the switching FET and must be connected to the drain of the switching FET. The output of the logic gate is connected to the drain of the FET switching element. A bias voltage is applied to the drain of the load element so that the channel of the load element is totally depleted at the source end for large values of the switching FET drain voltage $V_d$ and is totally depleted at the drain end for low values of $V_d$, and is only partially depleted everywhere along the channel for the intermediate values of $V_d$. As a consequence, the current-voltage characteristic of the load element has a bell-type shape with very low power consumption at both its low and high output states.

BRIEF DESCRIPTION OF THE DRAWINGS

FIG. 1 shows a preferred embodiment of the folded gate FET logic gate structure of the present invention.

FIGS. 2A, 2B and 2C are diagrams illustrating the qualitative shape of the depletion region in the FET load of the folded gate for a low, intermediate and large drain voltage $V_d$, respectively.

FIG. 3 is a graph of output current as a function of switching FET drain voltage $V_d$ showing the current-voltage characteristics of switching FETs and loads for a conventional DCFL gate (solid lines) and for the folded gate of the present invention, together with the current-voltage characteristic of the gate diode of the next stage (dotted line).

DETAILED DESCRIPTION OF THE PREFERRED EMBODIMENTS

In FIG. 1, folded logic gate 10 includes switching FET 12, load element 14 and insulator layer 16. FET switching element 12 is mounted over and is separated from load element 14 by insulator layer 16.

In the embodiment shown in FIG. 1, switching FET 12 is an enhancement mode N channel Schottky gate FET which is formed in a first semiconductor layer 18 which is deposited on the top surface of insulator layer 16. Switching FET 12 includes N type channel 20, N+ source region 22, N+ drain region 24 and Schottky barrier gate or metal insulator semiconductor gate 26 formed on a top surface of first semiconductor layer 18. Ohmic contacts 28 and 30 contact the top surfaces of source 22 and drain 24, respectively.

Load element 14 is positioned below insulating layer 16 in semi-insulating substrate 32. Load element 14 includes N type channel 34, N+ source region 36, N+ drain region 38. Ohmic contacts 40 and 42 make contact to source region 36 and drain region 38, respectively.

As shown in FIG. 1, channel 34 of load element 14 is positioned below insulator layer 16 so that channel 20 of switching FET 12 is spaced from channel 34 by insulator layer 16 and is located essentially over the center portion of channel 34.

As shown in FIG. 1, input terminal 44 of logic gate 10 is connected to gate 26 of switching FET 12. Output terminal 46, which is connected to the next logic gate stage (not shown) is connected in this preferred embodiment to drain contact 30 of switching element 12 and source contact 40 of load element 14. Drain voltage $V_d$ of switching element 12, therefore, is the output voltage $V_{OUT}$, and is also the voltage applied to source 36 of load element 14. Bias voltage $V_{DD}$ is applied to drain 38 through contact 42, and source 22 is connected to ground through contact 28.

Insulator layer 16 is thin enough that strong capacitive coupling occurs between switching FET 12 and load element 14. In this case, therefore, switching FET 12 acts as a gate for load element 14. At the same time, load element 14 acts as a second gate for switching FET 12. Because the potential of load element 14 is more positive than the potential of channel 20 of switching FET 12, it induces extra carriers into channel 20. On the other hand, channel 34 of load element 14 is depleted by the charge induced by switching FET 12.

The total charge of donors in channel 34 of load element 14 and the bias voltage $V_{DD}$ are chosen so that channel 34 is totally depleted at the drain end for low values of drain potential $V_d$ (as shown in FIG. 2A), is partially depleted along its entire length for intermediate values $V_d$ (FIG. 2B), and is totally depleted at the source end for large values of the $V_d$ (FIG. 2C).

As a consequence, the load current characteristic of logic gate 10 has a bell shape as shown in dashed lines in FIG. 3. There are very low currents for $V_d$ close to zero and for $V_d$ close to $V_{DD}$, and a much larger current in the intermediate range.

Also shown in dashed lines is the current-voltage characteristics of switching FET 12. When the input gate voltage $V_{IN}$ applied to gate 26 is low (less than the threshold voltage of switching FET 12), FET 12 is off and the high state output voltage is determined by the intersection of the current voltage characteristic of the load and the current voltage characteristic of the Schottky diode of the next stage (which is shown in dotted lines in FIG. 3). This intersection is labeled as point H1 in FIG. 3.

When the input gate voltage $V_{IN}$ is high, the next stage is off and the low state output voltage is determined by the intersection of the load current-voltage characteristic of the load with the current-voltage characteristic of the switching FET in the ON state. This is labeled as point L1 in FIG. 3, and is essentially zero.

For comparison, the current-voltage characteristics of the switching FET and load of a conventional DCFL gate are shown in solid lines in FIG. 3. As seen in FIG. 3, the current through the load of the DCFL gate is at a maximum when $V_d=0$ and decreases to essentially zero when $V_d=V_{DD}$. In the conventional DCFL gate, the high state output voltage occurs when the input voltage $V_{IN}$ to the gate is low, and is determined by the intersection of the current-voltage characteristic of the load and the current-voltage characteristic of the gate of the next stage. This is designated by point H2 in FIG. 3.

The low state output voltage occurs when the input voltage $V_{IN}$ to the DCFL gate is high, and is determined by the intersection of the load current-voltage characteristic with the current-voltage characteristic of the switching FET in the on-state. This is designated as point L2 in FIG. 3.

FIG. 3 illustrates two significant differences in the performance of the folded gate of the present invention and the DCFL gate. First, the value of the low state output voltage is significantly lower with the folded gate, thus resulting in a wider output voltage swing between the high and low states.

Second, the load current of the folded gate is very low at both of its stable output states. In contrast, the DCFL gate exhibits significant load current at the low output state.

Third, because of the bell-shape load current-voltage characteristic, the load current at the intermediate voltages can be even higher than for a conventional load in a DCFL gate. This results in comparable or higher speed operation for comparable characteristic capacitances.

In the embodiment shown in FIG. 1, gate 26 is a Schottky diode gate. In other embodiments in which a metal-insulator-semiconductor (MIS) gate is used, the power consumption in the high output state is nearly zero (point H3 shown in FIG. 3). This corresponds to CMOS-like operation.

In one embodiment of the present invention, folded gate 10 is a metal-GaAs-AlGaAs-GaAs semiconductor device. Substrate 32 is a GaAs semi-insulating substrate. Insulator layer layer 16 is undoped AlGaAs which is grown by molecular beam epitaxy. Semiconductor layer 18 is a GaAs layer which is also grown by molecular beam epitaxy on the top surface of insulator layer 16. Channels 20 and 34, sources 22 and 36, and drains 24 and 38 are formed using a self-aligned ion implantation process like the one described in N.C. Cirillo, Jr., J. K. Aabrokwah and M. S. Shur, "Self-aligned Modulation-Doped (Al,Ga)AS/GaAs Field-Effect Transistors", *IEEE Electron Device Letters*, Vo. EDL-5, No. 4 pp. 129-131, April 1984.

The curves shown in FIG. 3 are for metal-GaAs-AlGaAs-GaAs structures, and were calculated using a charge control model similar to the model described in M. S. Shur, "Low Field Mobility, Effective Saturation Velocity and Performance of Submicron GaAs MESFETs", *Electronics Letters*, Vol. 18, No. 21, pp. 909-910, 1982. The length of channel 20 was 1 micron, the length of channel 34 was 3.5 microns, the device width was 10 microns, the donor level of channel 20 was $N_1=1.5\times 10^{17}$ cm$^{-3}$, and the donor level of channel 34 was $N_2=2\times 10^{17}$ cm$^{-3}$. The thickness of channel 20 was 0.08 microns, the thickness of channel 34 was 0.08 microns, the thickness of insulator layer 16 0.05 was microns, the electron saturation velocity $1.5\times 10^5$ m/s, the low field electron mobility 0.3 m$^2$/Vs, the contact resistance 50 ohms, the gate diode saturation current $10^{-12}$A, the ideality factor n=1.4, and the diode series resistance 50 ohms. The curves for the standard DCFL gate were calculated using the same parameters except that $N_2$ was chosen to be $1.7\times 10^{17}$ cm$^{-3}$.

In conclusion, the folded gate is a majority carrier device which may be implemented using a variety of different technologies and different materials. Although a GaAs-AlGaAs-GaAs structure has specifically been described, the present invention is equally applicable to other semiconductor materials including silicon. The present invention allows CMOS-like operation with very low power consumption in the stable states, speeds which are comparable to or higher than the speed of conventional DCFL gates, and larger output voltage swings than with DCFL gates.

Although the present invention has been described with reference to preferred embodiments, workers skilled in the art will recognize that changes may be made in form and detail without departing from the spirit and scope of the invention.

What is claimed is:

1. A logic gate comprising:
   a FET switching element having a first gate, a drain, a source and a channel of a first conductivity type;
   a load element having a drain, a source and a channel of the first conductivity type, the source of the load element being located generally under the source of the FET switching element;
   means for electrically connecting the source of the load element to the drain of the FET switching element; and
   a low conductivity layer positioned between the FET switching element and the load element for separating and capacitively coupling the FET switching element and the load element so that the switching element acts as a gate for the load element and the load element acts as a second gate of the FET switching element.

2. The logic gate of claim 1 and further comprising:
   an input terminal connected to the gate of the FET switching element; and an output terminal connected to the drain of the FET switching element and the source of the load element.

3. The logic gate of claim 2 and further comprising: means for electrically connecting the drain of the load element to a bias voltage.

4. The logic gate of claim 3 wherein the channel of the load element has a carrier concentration which for values of drain voltage $V_d$ of the FET switching element near zero causes one end of the channel to be totally depleted, which for values of $V_d$ near the bias voltage cause an opposite end of the channel to be totally depleted, and which for intermediate values of $V_d$ cause the channel to be partially depleted along its entire length.

5. The logic gate of claim 1 wherein the FET switching element is an enhancement mode FET.

6. The logic gate of claim 1 wherein the FET switching element is a normally-on FET.

7. A logic gate comprising:
a first semiconductor layer;
a second semiconductor layer positioned below the first semiconductor layer;
a low conductivity layer positioned between the first and second semiconductor layers;
a FET formed in the first semiconductor layer, the FET having a first gate, a source, a drain, and a channel of a first conductivity type between the source and drain; and
a load element formed in the second semiconductor layer, the load element having a source, a drain and a channel of the first conductivity type between the source and drain, the load element capacitively coupled to the FET so that the channel of the FET acts as a gate for the load element and the load element acts as a second gate for the FET; and
means for electrically connecting the source of the load element to the drain of the FET.

8. The logic gate of claim 7 and further comprising:
an input terminal connected to the gate of the FET; and
an output terminal connected to the drain of the FET.

9. The logic gate of claim 8 and further comprising:
means for electrically connecting the drain of the load element to a bias voltage.

10. The logic gate of claim 7 wherein the source of the load element is located generally under the source of FET.

* * * * *